(12) United States Patent
Hwang et al.

(10) Patent No.: US 9,093,337 B2
(45) Date of Patent: Jul. 28, 2015

(54) METHODS FOR CONTROLLING WARPAGE IN PACKAGING

(71) Applicant: Taiwan Semiconductor Manufacturing Company, Ltd., Hsin-Chu (TW)

(72) Inventors: Chien Ling Hwang, Hsin-Chu (TW); Bor-Ping Jang, Chu-Bei (TW); Hsin-Hung Liao, Taipei (TW); Yeong-Jyh Lin, Caotun Township (TW); Hsiao-Chung Liang, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 14/040,160

(22) Filed: Sep. 27, 2013

(65) Prior Publication Data

US 2015/0093858 A1   Apr. 2, 2015

(51) Int. Cl.
*H01L 23/00* (2006.01)
*H01L 23/538* (2006.01)
*H01L 21/78* (2006.01)
*H01L 21/56* (2006.01)

(52) U.S. Cl.
CPC .............. *H01L 24/14* (2013.01); *H01L 21/568* (2013.01); *H01L 21/78* (2013.01); *H01L 23/5389* (2013.01); *H01L 24/11* (2013.01); *H01L 24/94* (2013.01); *H01L 24/96* (2013.01); *H01L 24/97* (2013.01); *H01L 2224/49171* (2013.01); *H01L 2224/96* (2013.01)

(58) Field of Classification Search
CPC ... H01L 24/97; H01L 21/568; H01L 23/5389; H01L 2224/49171; H01L 24/94; H01L 2224/96; H01L 24/96; H01L 21/78
See application file for complete search history.

(56) References Cited

U.S. PATENT DOCUMENTS

| | | | | |
|---|---|---|---|---|
| 2005/0048698 | A1* | 3/2005 | Yamaguchi | 438/109 |
| 2009/0115042 | A1* | 5/2009 | Koyanagi | 257/686 |
| 2009/0224400 | A1* | 9/2009 | Rahman | 257/713 |
| 2010/0314746 | A1* | 12/2010 | Hsieh et al. | 257/692 |
| 2013/0119552 | A1* | 5/2013 | Lin et al. | 257/774 |
| 2014/0252573 | A1* | 9/2014 | Lin et al. | 257/666 |

* cited by examiner

*Primary Examiner* — Bac Au
(74) *Attorney, Agent, or Firm* — Slater & Matsil, L.L.P.

(57) ABSTRACT

A method includes placing a plurality of dummy dies over a carrier, placing a plurality of device dies over the carrier, molding the plurality of dummy dies and the plurality of device dies in a molding compound, forming redistribution line over and electrically coupled to the device dies, and performing a die-saw to separate the device dies and the molding compound into a plurality of packages.

20 Claims, 13 Drawing Sheets

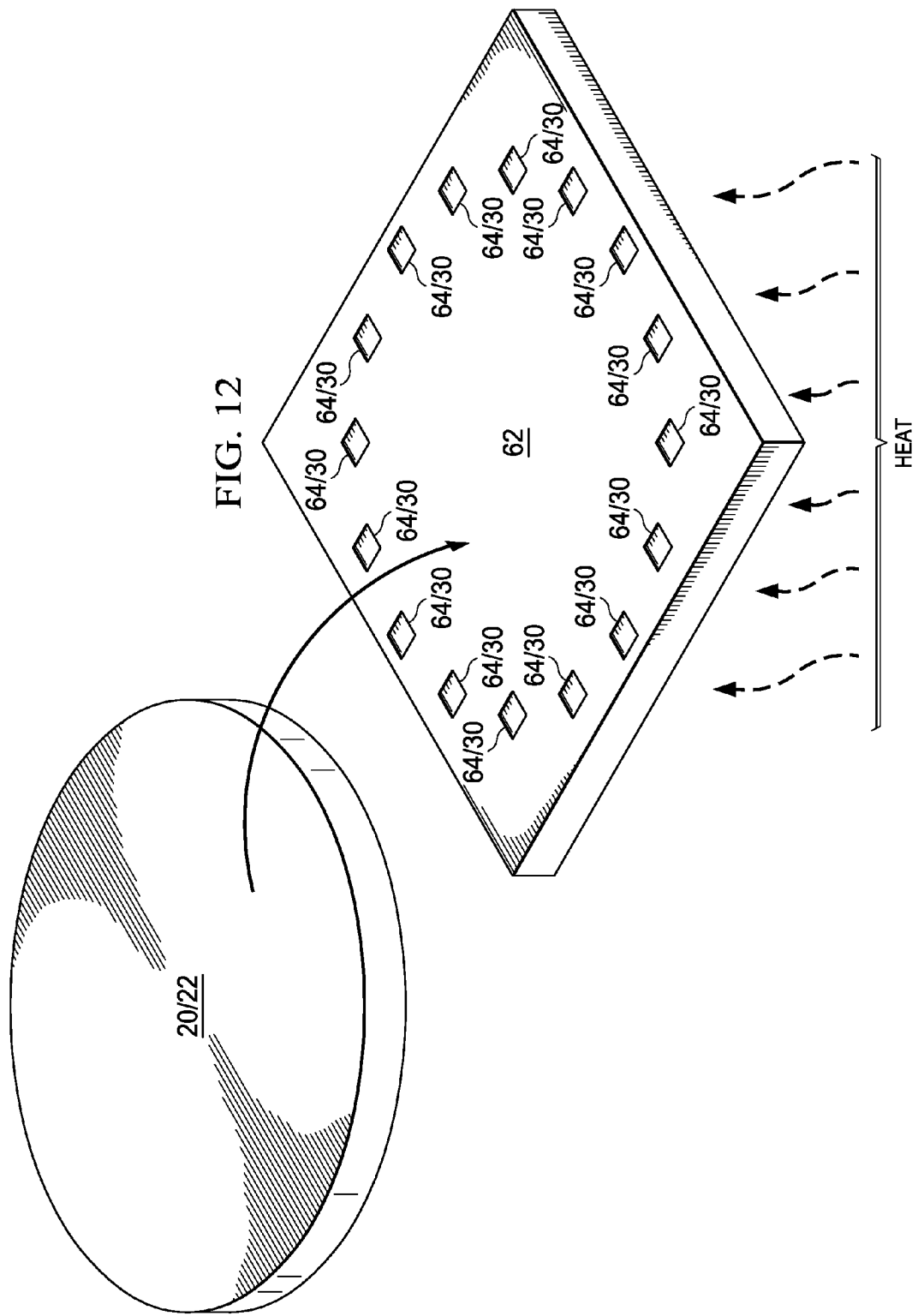

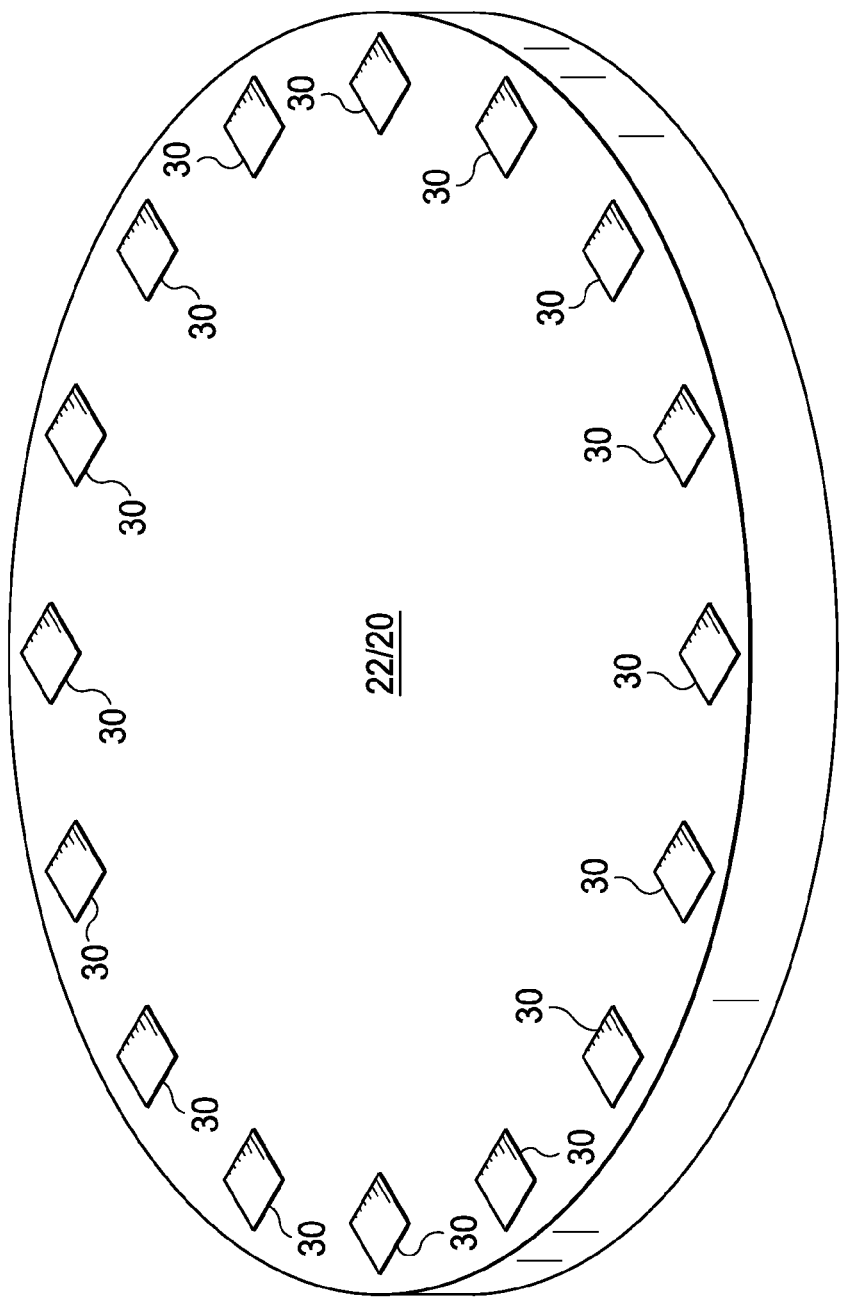

METHODS FOR CONTROLLING WARPAGE IN PACKAGING

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly with time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 7 through 13 illustrate the intermediate stages for placing dummy dies over a carrier in accordance with alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fan-out wafer level package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1A:
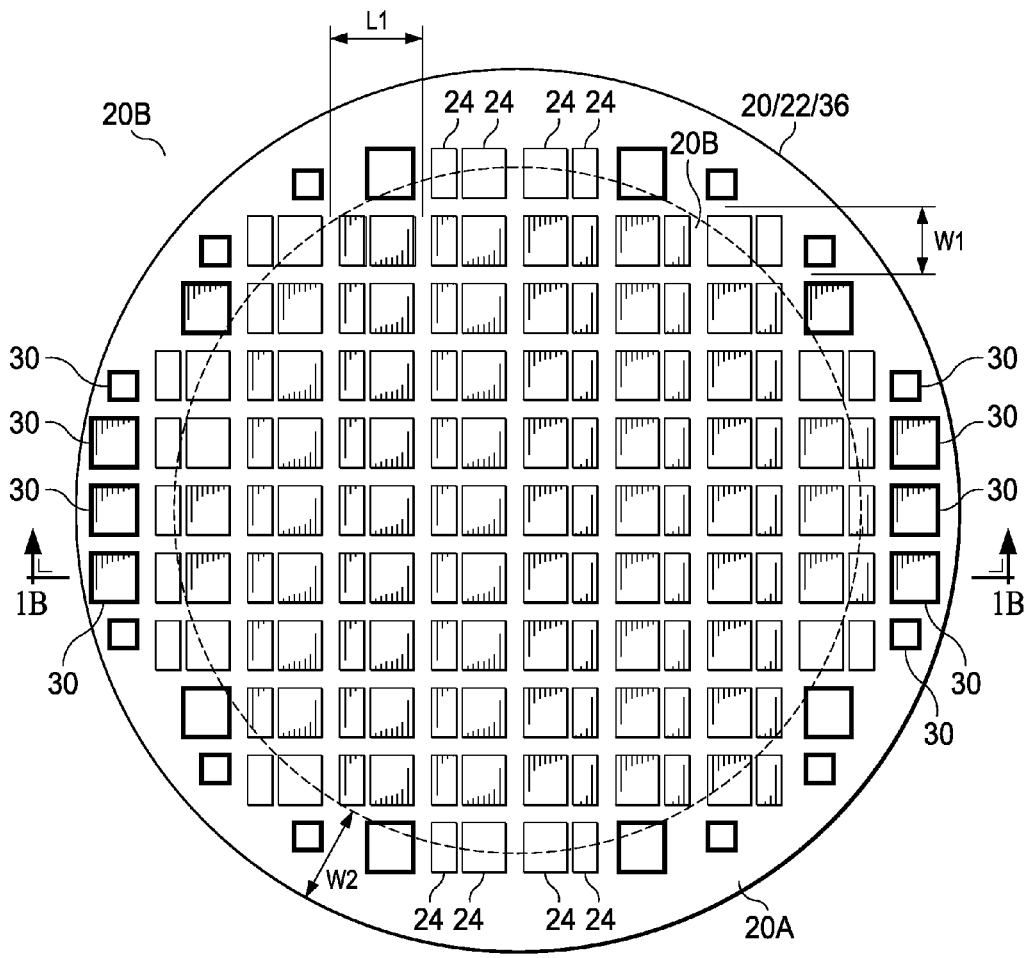
FIGS. 1A and 1B illustrate a top view and a cross-sectional view, respectively, of an intermediate stage in the manufacturing of a fan-out package in accordance with some exemplary embodiments, wherein device dies and dummy dies are placed over a carrier.
Figure 1B:
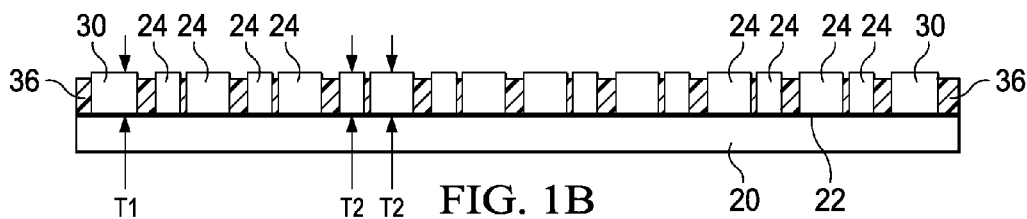

FIGS. 1A and 1B illustrate a top view and a cross-sectional view, respectively, of an intermediate stage in the manufacturing of a package. Referring to FIG. 1B, carrier 20 is provided. In some exemplary embodiments, carrier 20 is a blanket wafer, which may be a glass wafer, a quartz wafer, a ceramic wafer, an organic wafer, or the like. Furthermore, carrier 20 may be formed of a homogeneous material. Carrier wafer 20 has a planar top surface. Carrier 20 may have a circular top-view shape, as shown in FIG. 1A. Die-attach film 22 is laminated on the planar top surface of carrier 20. In some embodiments, die-attach film 22 comprises an organic material, which may be a polymer-based material. Die-attach film 22 may be adhesive when heated.

Device dies 24 and dummy dies 30 are placed over, and adhered to, die-attach film 22. In some embodiments, device dies 24 include semiconductor substrates 26 (FIG. 5), and active devices such as transistors 28 formed at the surface of semiconductor substrates 26. Semiconductor substrates 26 may be silicon substrates, or may be formed of other semiconductor materials. In the illustrated embodiments, there are two device dies 24 placed next each other as a group, which group is sawed in the subsequent step into the same package 60 (FIG. 6). The two device dies 24 in the same package may have different structures, although their structures may also be the same as each other. In alternative embodiments, one resulting package 60 (FIG. 6) may include one device die or more than two device dies.

As shown in FIG. 1A, device dies 24 are placed to overlap the inner area of carrier 20, and are placed as a plurality of rows and columns, wherein each row has a width equal to W1, and each column has a length equal to L1. Each of the areas in one row and one column is referred to as a package area, in which a package will be formed.

In the peripheral area of the carrier, there are some areas that are not large enough to place device dies 24. These chip areas (referred to as partial chip areas) are in the peripheral region 20A of carrier 20, which peripheral region 20A extends from the edge of carrier 20 toward the center of carrier 20. Peripheral region 20A encircles inner region 20B. In some embodiments, the peripheral region includes a ring that has width W2 smaller than about 25 mm. Dummy dies 30 are placed in the partial chip areas. In some embodiments, no dummy die 30 is placed to overlap inner region 20B of carrier 20. Throughout the description, the term "dummy die" refers to the die or chip that does not have any electrical function, and the dummy die does not contribute to the electrical operation of the resulting package. Dummy dies 30 may be formed of a homogenous material without any circuit, metal line, and/or sub-layer therein.

Dummy dies 30 may be formed of glass, quartz, blank silicon, or the like. The Coefficient of Thermal Expansion (CTE) of dummy dies 30 is lower than the CTE of molding compound 36 (FIG. 1B), which are molded between device dies 24 and dummy dies 30. In some exemplary embodiments, the CTE of dummy dies 30 is between about 0.5 ppm/° C. (μm/m/° C.) and about 7.5 ppm/° C. It is appreciated, however, that the values recited throughout the description are merely examples, and may be changed to different values.

In some embodiments, as shown in FIG. 1B, the thickness T1 of dummy dies 30 is close to the thicknesses T2 of device dies 24, for example, with the difference between T1 and T2 being smaller than about 10 percent of either one of thicknesses T1 and T2. In some embodiments, thickness T1 of dummy dies 30 is smaller than the thicknesses T2 of device dies 24. The top-view area of dummy dies 30 is smaller than the top-view area of the resulting package 60 (FIG. 6). In some embodiments, all dummy dies 30 that are placed over carrier 20 have the same size and same shape. In alternative embodiments, dummy dies 30 have more than one shape and/or size to fit different areas.

As also shown in FIG. 1B, after the placement of device dies 24 and dummy dies 30, molding compound 36 is filled into the gaps between device dies 24 and dummy dies 30. Molding compound 36 has a CTE greater than the CTE of dummy dies 30. In some embodiments, the CTE of molding compound 36 is in the range between about 7 ppm/° C. and about 50 ppm/° C. Furthermore, the CTE of molding compound 36 may be greater than the CTE of dummy dies 30 by a difference greater than about 3 ppm/° C., or greater than about 5 ppm/° C., although greater or smaller differences may also be usable. The difference in CTEs may also be in the range between about 1 ppm/° C. and about 10 ppm/° C. In an exemplary molding process, molding compound 36 is molded, with a top surface of molding compound 36 being higher than the top surfaces of device dies 24 and dummy dies 30. A curing process is then performed to cure molding compound 36. Next, a planarization, such as a grinding, is performed to remove excess molding compound 36, so that the top surface of molding compound 36 is planar. In an embodiment, the planarization is performed until the top surfaces of device dies 24 are exposed. The top surfaces of dummy dies 30 may or may not be exposed after the planarization. Accordingly, there may be, or may not be, a layer of molding compound 36 covering dummy dies 30.

Figure 2:
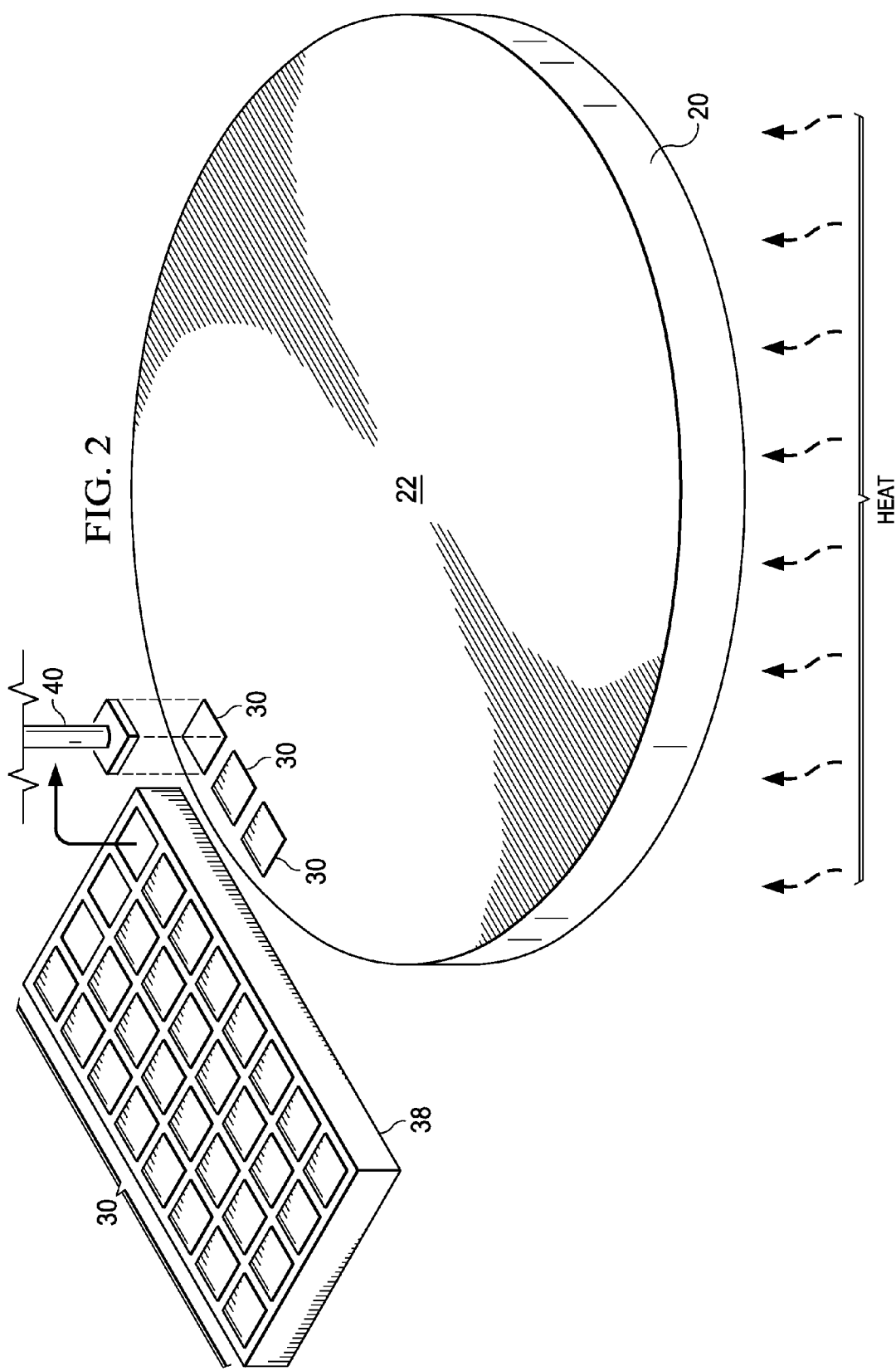
FIGS. 2-4 illustrate the intermediate stages in the formation of the structure shown in FIGS. 1A and 1B.
Figure 3:
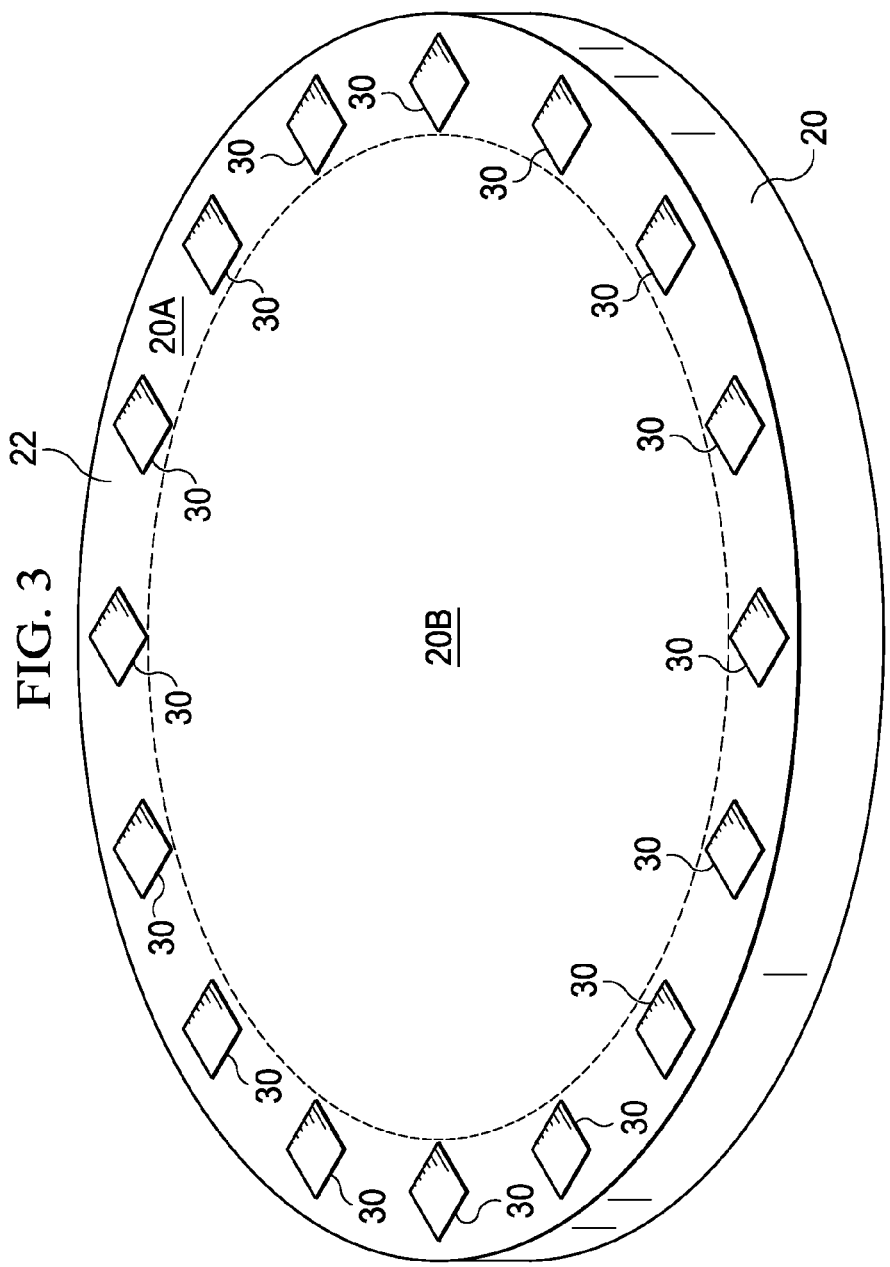
Figure 4:
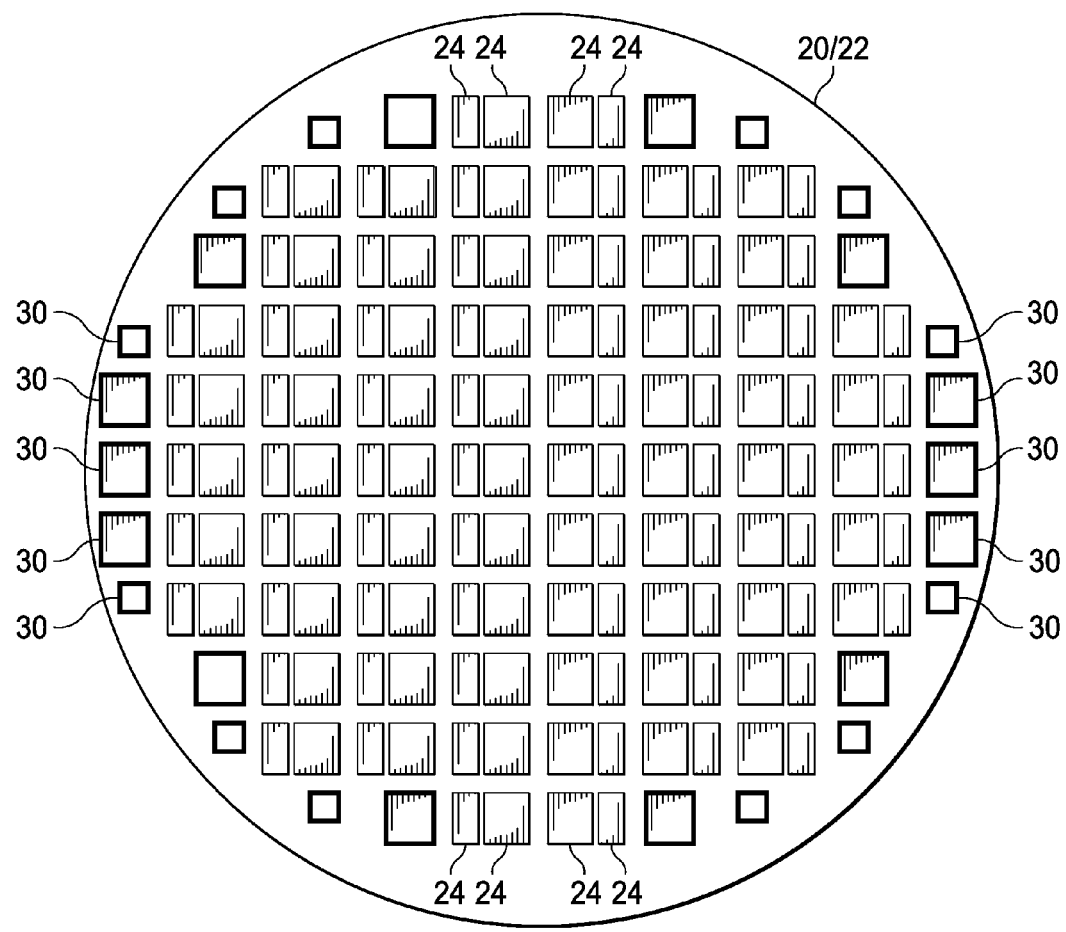

The placement of dummy dies 30 and device dies 24 is illustrated in FIGS. 2 through 4 in accordance with some embodiments. Referring to FIG. 2, carrier 20 is provided. Die-attach film 22 is laminated on the top surface of carrier 20. Dummy dies 30 are first placed in tray 38, from which pick-and-place tool 40 is used to pick up dummy dies 30 one by one. Pick-and-place tool 40 places dummy dies 30 onto the desirable locations of die-attach film 22, wherein the desirable locations are described referring to FIG. 1A. During the placement, carrier 20 may be heated, and hence die-attach film 22 is accordingly heated, for example, to a temperature in the range between about 80° C. and about 150° C. Accordingly, die-attach film 22 is adhesive, and dummy dies 30 may be placed thereon. In the embodiments in which dummy dies 30 include different types having different sizes and/or different shapes, there may be more than one tray 38, each configured to hold one type of dummy dies 30. In these embodiments, pick-and-place tool 40 is configured to pick-and-place dummy dies 30 from different trays.

FIG. 3 illustrates the carrier 20 and die-attach film 22 with dummy dies 30 thereon. As shown in FIG. 3, dummy dies 30 are placed overlapping the peripheral region 20A of carrier 20, with the inner region 20B of carrier 20 not being placed with dummy dies 30. Next, as shown in FIG. 4, device dies 24 are placed, for example, using the pick-and-place tool 40 (FIG. 2). In alternative embodiments, device dies 24 are placed on die-attach film 22 before the placement of dummy dies 30. After all device dies 24 and dummy dies 30 are placed, molding compound 36 (FIG. 1B) is molded. The molding process has been discussed referring to FIG. 1B. The resulting structure is shown in FIGS. 1A and 1B.

Figure 5:
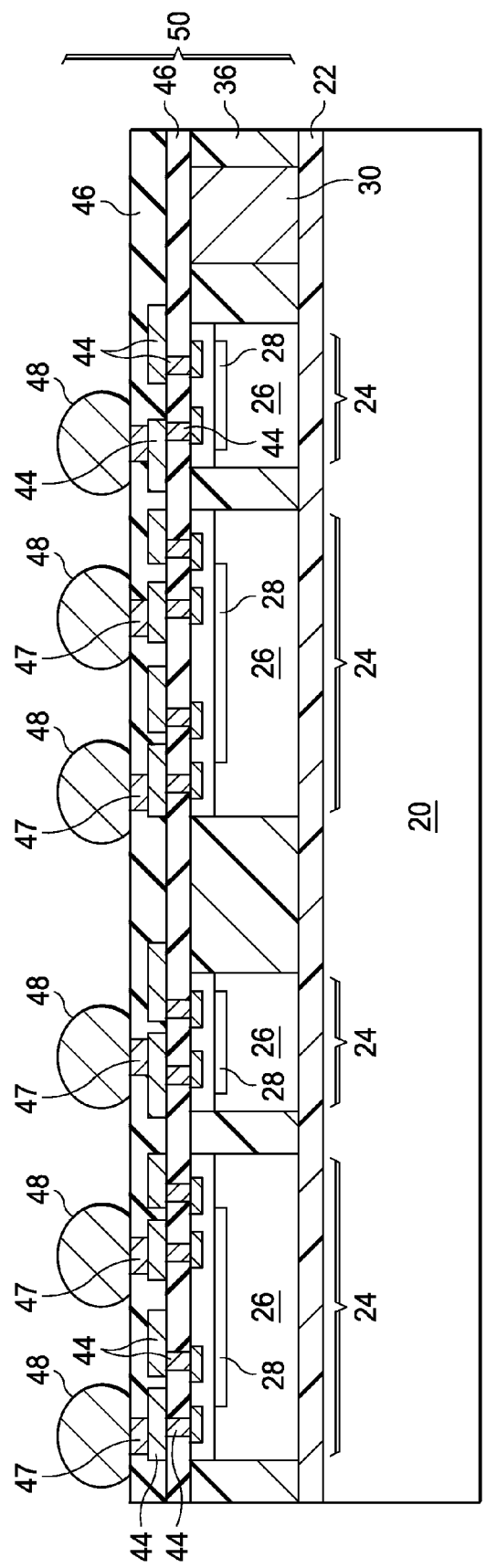
FIGS. 5 and 6 illustrate the formation of redistribution lines to connect to the device dies, and the die-saw process to separate packages from each other.
Figure 6:
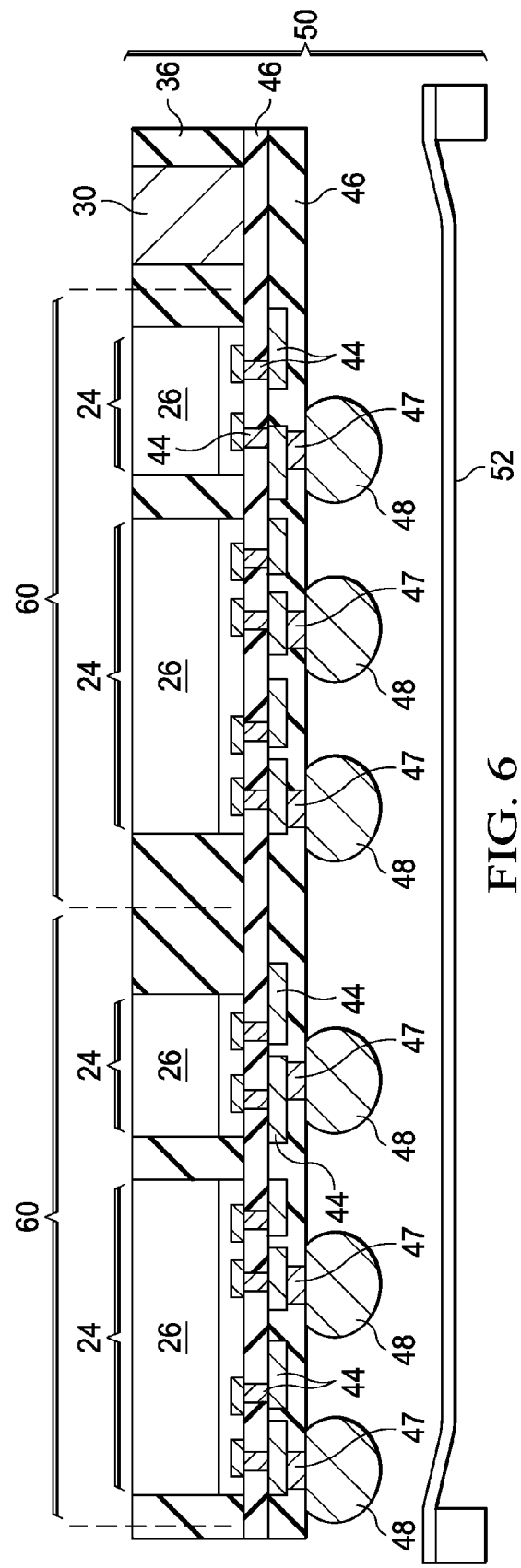

FIGS. 5 and 6 illustrate the process steps performed after the molding of device dies 24 and dummy dies 30. Referring to FIG. 5, Redistribution Lines (RDLs) 44 and dielectric layers 46 are formed to connect to the devices 28 (such as transistors) in device dies 24. Dielectric layers 46 in these embodiments may comprise polyimide, benzocyclobutene (BCB), polybenzoxazole (PBO), or the like. Alternatively, dielectric layers 46 may include non-organic dielectric materials such as silicon oxide, silicon nitride, silicon carbide, silicon oxynitride, or the like. Redistribution lines 44 may be formed of aluminum, copper, nickel, tungsten, or other conductive materials. RDLs 44 have a fan-out structure, which means that RDLs 44 extend beyond the boundaries of the respective underlying device dies 24, and hence RDLs 44 are redistributed to the areas (in the top view of FIG. 5) larger than the respective underlying device dies 24.

FIG. 5 also illustrates the formation of electrical connectors 48 in accordance with some exemplary embodiments. The formation of electrical connectors 48 may include forming Under-Bump Metallurgies (UBMs) 47 on RDLs 44, placing solder balls on the exposed portions of UBMs 47, and then reflowing the solder balls. In alternative embodiments, the formation of electrical connectors 48 includes performing a plating step to form solder regions over RDLs 44 or UBMs 47, and then reflowing the solder regions. Electrical connectors 48 may also include metal pillars, or metal pillars and solder caps, which may also be formed through plating. In the embodiments in which electrical connectors 48 are solder balls, the lower parts of solder balls 48 may be molded in a molding compound (not shown), while the upper parts of solder balls 48 are exposed. Throughout the description, the combined structure including device dies 24, molding compound 36, and the overlying RDLs 44 and dielectric layers 46 is referred to as composite package 50, which may be a composite wafer.

Next, composite package 50 is de-bonded from carrier 20. Die-attach film 22 is also removed from package 50. The resulting structure is shown in FIG. 6. As a result of the de-bonding, molding compound 36 and the back surfaces of device dies 24 and dummy dies 30 are exposed. Next, composite package 50 is further adhered to dicing tape 52, wherein electrical connectors 48 face toward, and may contact, dicing tape 52. Composite package 50 is sawed into a plurality of packages 60, which may be identical to each other. Each of packages 60 includes device die(s) 24, and may not include any dummy die 30.

FIGS. 7 through 11 illustrate the perspective views of intermediate stages in the forming of a package structure in accordance with alternative embodiments. In these embodiments, dummy dies 30 are pre-placed in recesses of a mold, and then are transferred to a die-attach film. During the transferring, the relative positions of dummy dies 30 are preserved. Unless specified otherwise, the reference numerals in these embodiments (and the embodiments in FIGS. 12 and 13) represent like elements in the embodiments illustrated in FIGS. 1 through 6.

Figure 7:
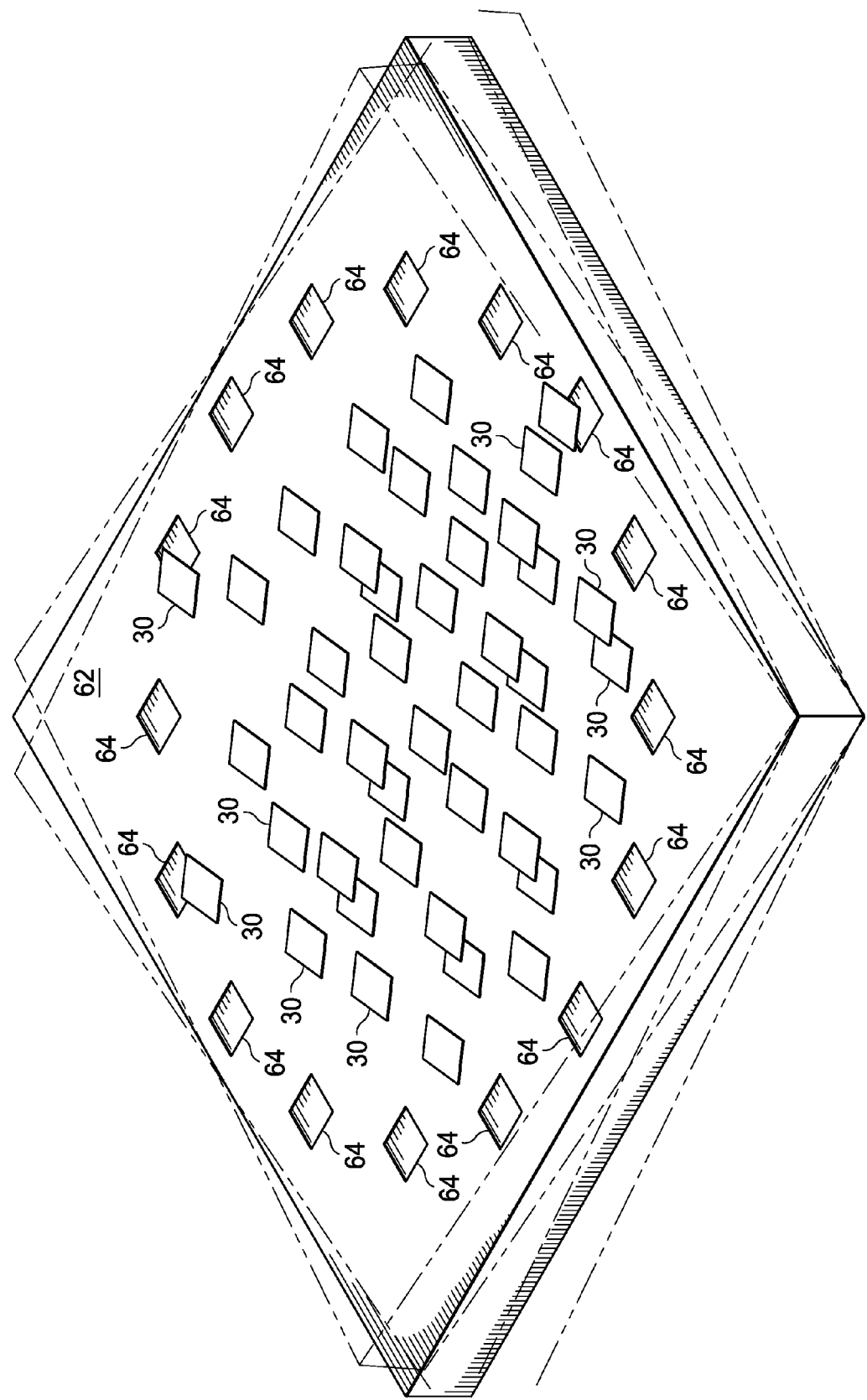

Referring to FIG. 7, mold 62 is provided. Mold 62 may be a metal mold, a ceramic mold, a graphite mold, a bakelite mold, or an organic mold. Recesses 64 are formed in mold 62, and extend from a planar top surface of mold 62 to an intermediate level of mold 62. The depths of recesses 64 may be equal to, slightly greater than, or slightly smaller than, the thicknesses of dummy dies 30. The positions of recesses 64 are designed to be the same as the positions of dummy dies 30 in FIG. 1A. The sizes of recesses 64 are designed to hold dummy dies 30 therein with a reasonable margin. For example, the lengths and widths of recesses 64 may be greater than the respective length and widths of dummy dies 30 by a margin between about 20 μm and about 100 μm.

Figure 8:
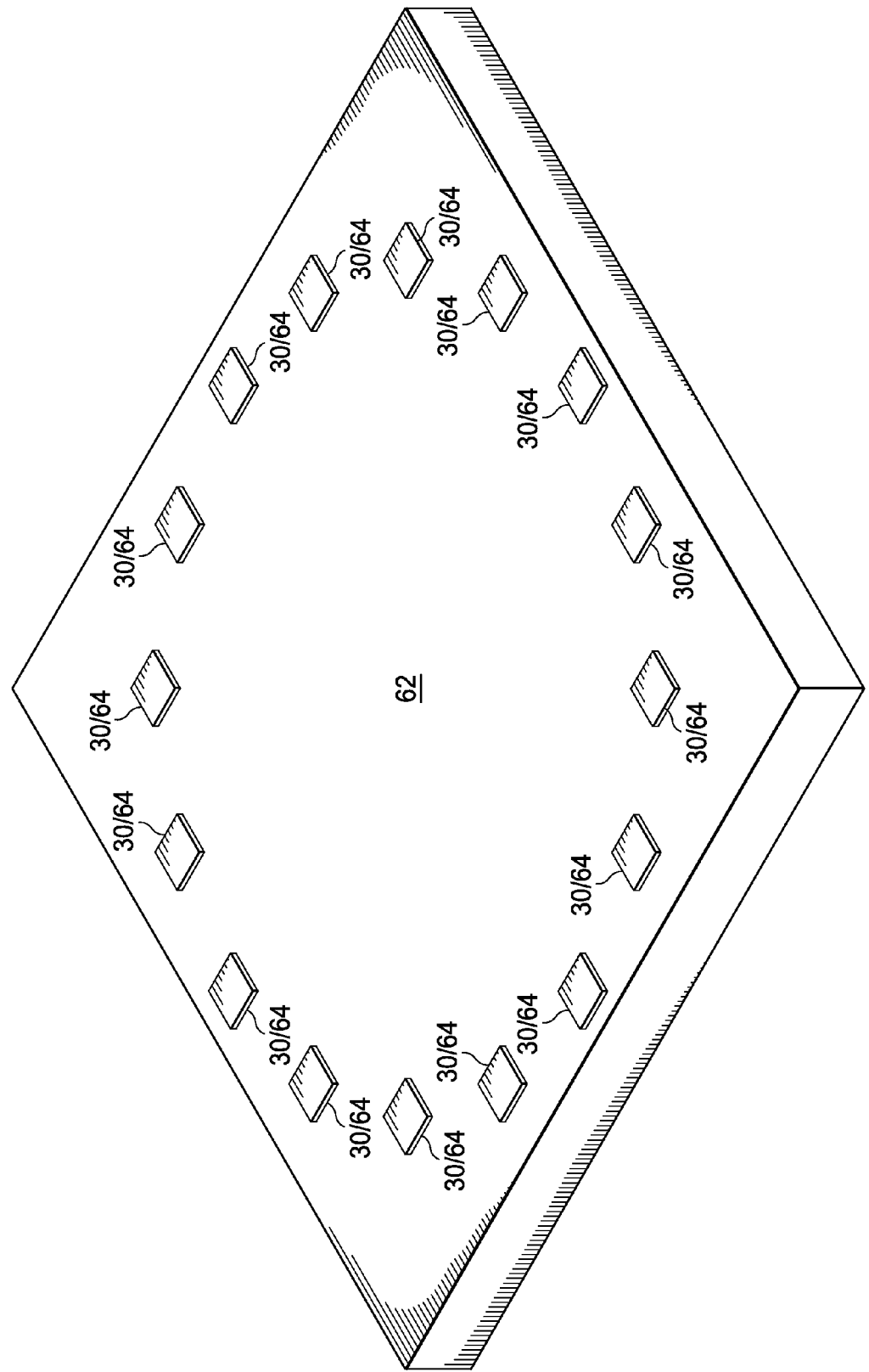

A plurality of dummy dies 30, which have the number greater than the number of recesses 64, is poured onto mold 62. Mold 62 is then vibrated, so that dummy dies 30 fall into recesses 64, with each of the recesses 64 filled with one dummy die 30. Excess dummy dies 30 are then removed. The resulting structure is shown in FIG. 8.

Figure 9:
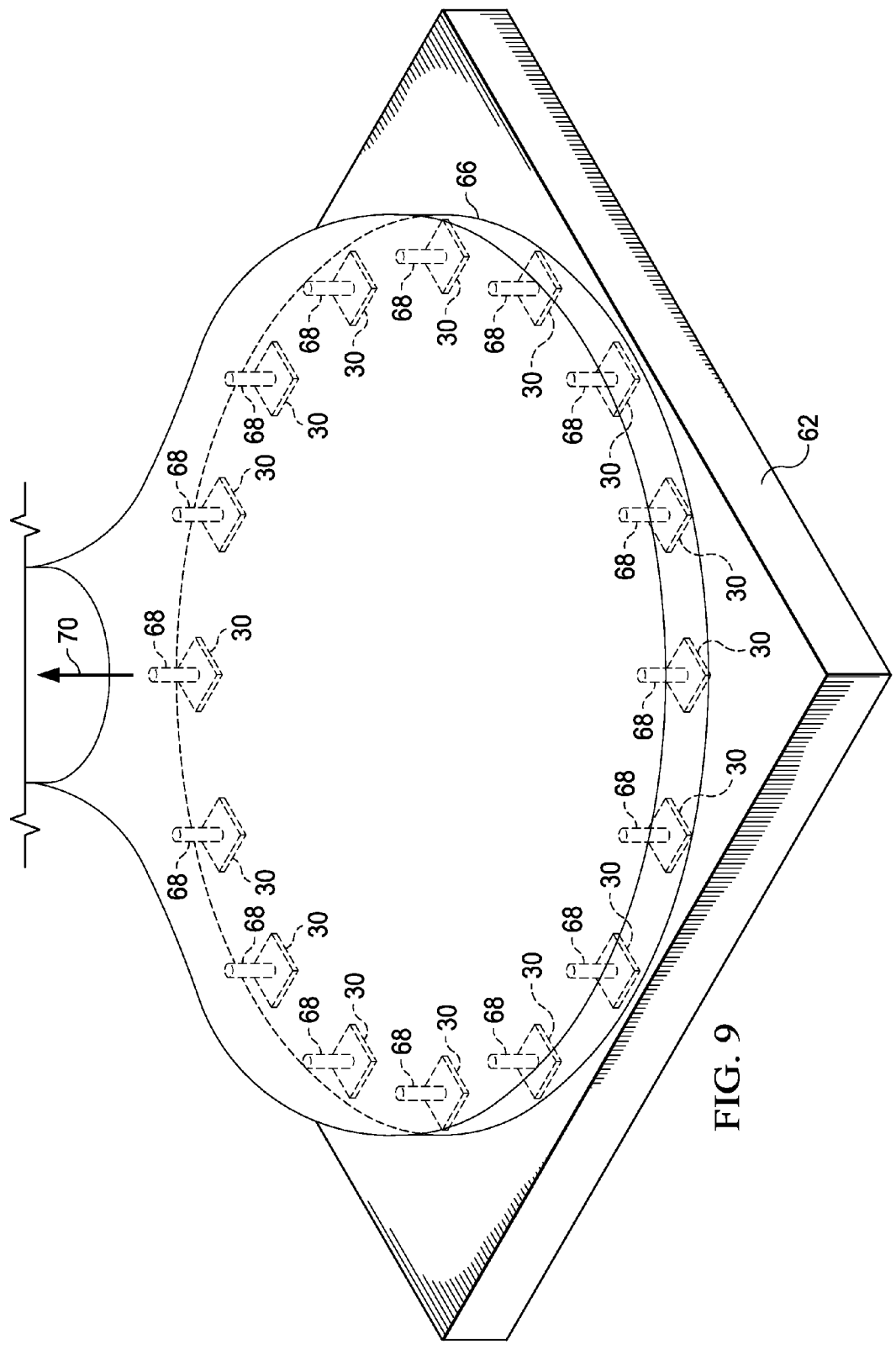

Next, as shown in FIG. 9, vacuum suction plate 66 is moved over mold 62 and dummy dies 30. Vacuum suction plate 66 includes a plurality of holes 68 therein, through which the air may be vacuumed in the direction of arrow 70. Each of holes 68 is aligned to one of dummy dies 30. Accordingly, through the vacuum, dummy dies 30 are picked up by vacuum suction plate 66 simultaneously.

Figure 10:
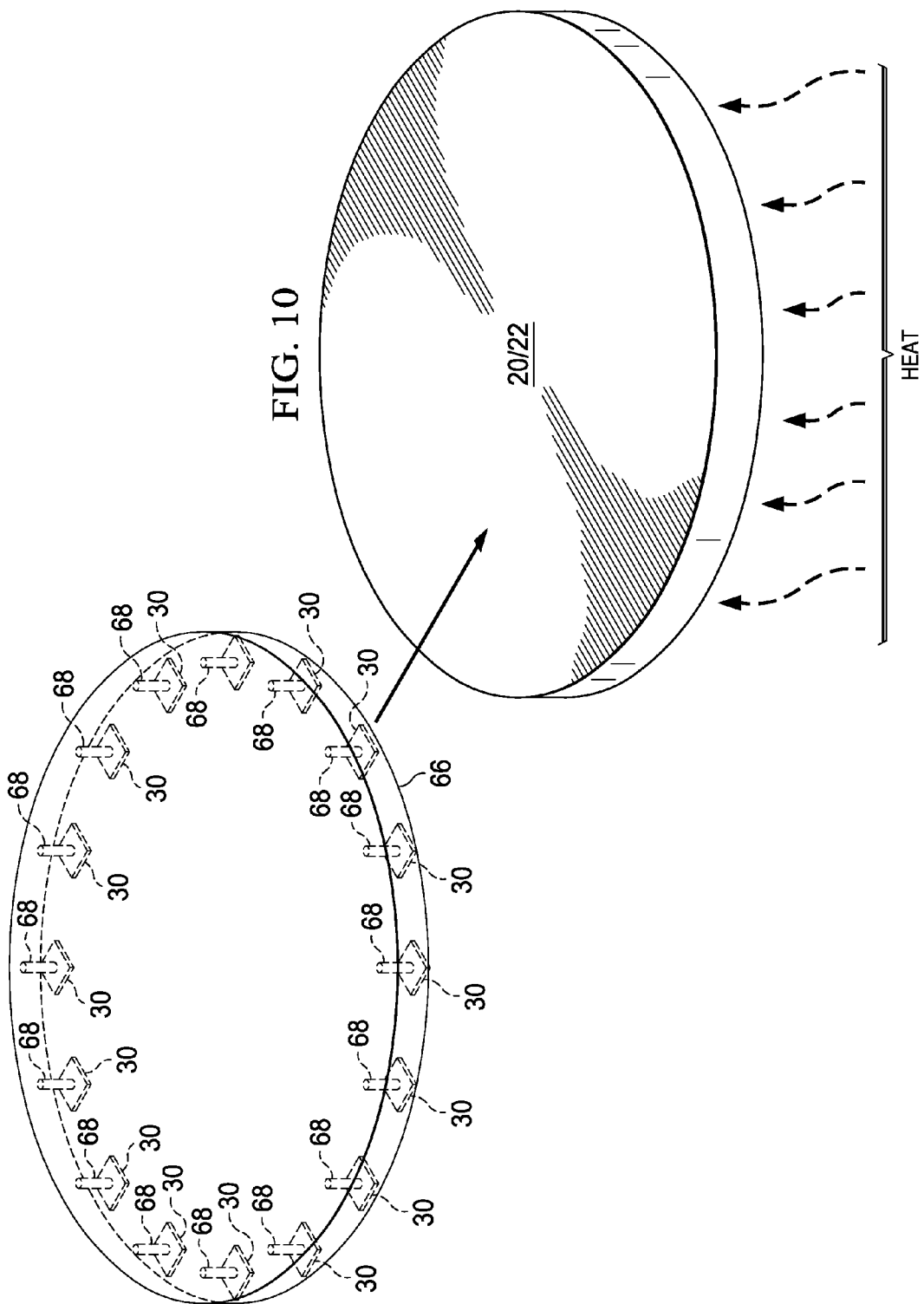
Figure 11:
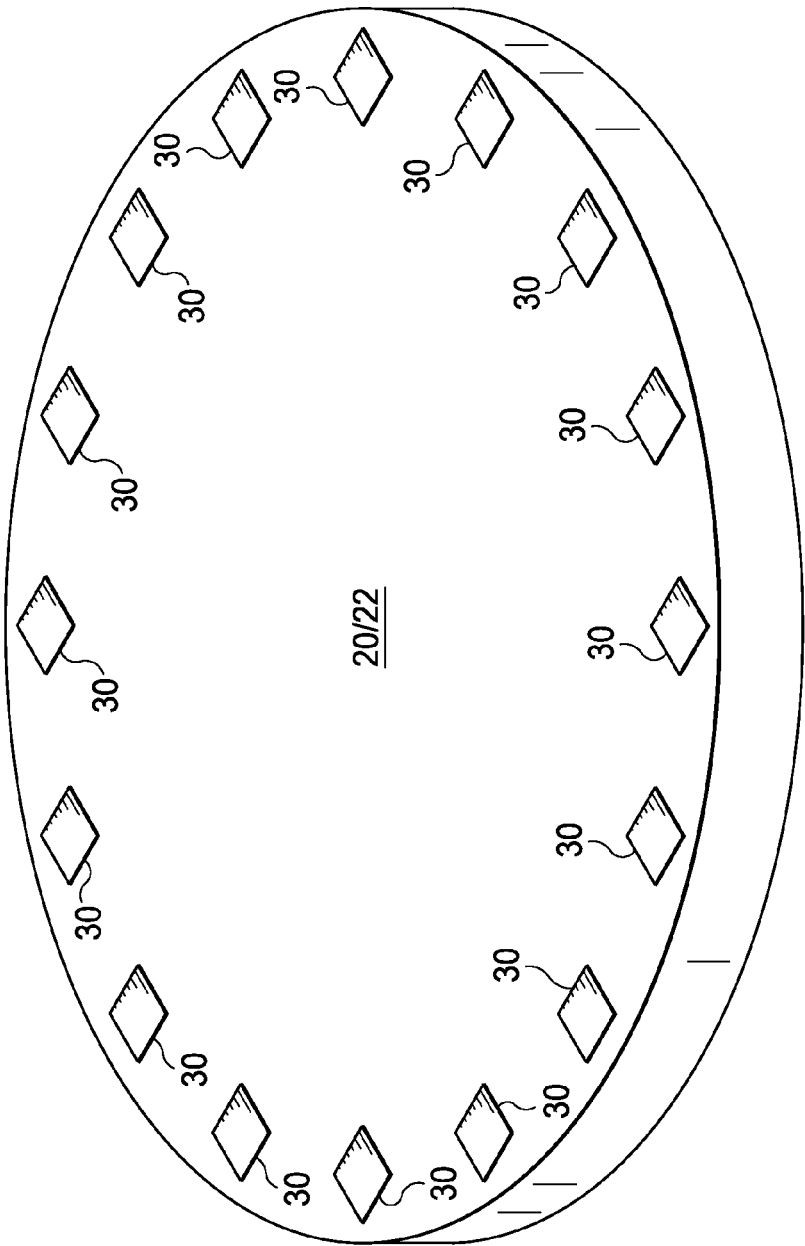

Referring to FIG. 10, vacuum suction plate 66 is moved over, and aligned to, carrier 20 and die-attach film 22. Dummy dies 30 are released on die-attach film 22. Carrier 20 is heated, and hence die-attach film 22 is sticky, so that dummy dies 30 are adhered to die-attach film 22. Through the process as illustrated in FIGS. 7 through 10, dummy dies 30 are transferred to die-attach film 22, with the relative positions of dummy dies 30 being the same as the relative positions shown in FIG. 1A. The resulting structure is shown in FIG. 11.

In subsequent processes, as shown in FIGS. 1A and 1B, device dies 24 are placed on die-attach film 22, followed by molding device dies 22 and dummy dies 30 in molding compound 36. In alternative embodiments, device dies 24 are placed over die-attach film 22 before the placement of dummy dies 30. The process steps in FIGS. 5 and 6 may then be performed to finish the packaging process.

FIGS. 12 and 13 illustrate the placement of dummy dies 30 in accordance with yet alternative embodiments. The initial steps of these embodiments are essentially the same as shown in FIGS. 7 and 8, during which dummy dies 30 are placed in recesses 64 in mold 62. In these embodiments, the thickness of dummy dies 30 is greater than the depths of recesses 64, so that dummy dies 30 protrude above the top surface of mold 62, for example, by about 20 μm to about 50 μm.

Next, as shown in FIG. 12, carrier 20 and die-attach film 22 are placed onto mold 62, with die-attach film 22 facing toward dummy dies 30. Before die-attach film 22 touches dummy dies 30, an alignment is performed, so that dummy dies 30 contact the desirable positions of die-attach film 22. Mold 62 is heated, and dummy dies 30 are also heated, for example, to a temperature in the range between about 80° C. and about 150° C. Accordingly, when dummy dies 30 contact die-attach film 22, dummy dies 30 are adhered to die-attach film 22.

Carrier 20 and die-attach film 22 are then lifted, with dummy dies 30 remain to be adhered on die-attach film 22 during the lifting. The resulting dummy dies 30 are hence placed on die-attach film 22, as shown in FIG. 13. In subsequent processes, as shown in FIGS. 1A and 1B, device dies 24 are placed on die-attach film 22, followed by molding device dies 24 and dummy dies 30 in molding compound 36. The process steps in FIGS. 5 and 6 may then be performed to finish the packaging process.

In the embodiments of the present disclosure, by placing dummy dies over a carrier along with the device dies, the dummy dies occupy the space that otherwise will be occupied by a molding compound. Since the dummy dies have a CTE smaller than the CTE of the molding compound, the overall CTE of the layer that includes the molding compound, the device dies, and the dummy dies is reduced compared to the layer that does not include the dummy dies. Since the CTE of the molding compound is much higher than the CTE of the carrier, during the manufacturing process, the carrier and the molding compound has warpage, which affects the manufacturing process, and sometimes makes the processes (such as the photolithography for forming RDLs and the suction of the carrier) infeasible. Accordingly, by reducing the overall CTE of the layer including the device dies and the molding compound through the addition of dummy dies, the warpage is reduced.

In accordance with some embodiments, a method includes placing a plurality of dummy dies over a carrier, placing a plurality of device dies over the carrier, molding the plurality of dummy dies and the plurality of device dies in a molding compound, forming redistribution line over and electrically coupled to the device dies, and performing a die-saw to separate the device dies and the molding compound into a plurality of packages.

In accordance with other embodiments, a method includes placing a plurality of dummy dies on a die-attach film, wherein the die-attach film is further overlying a carrier, and placing a plurality of device dies on the die-attach film. The plurality of dummy dies overlaps a peripheral region of the carrier, and the plurality of device dies overlaps an inner region of the carrier. The method further includes molding the plurality of dummy dies and the plurality of device dies in a molding compound to form a composite wafer, wherein the plurality of dummy dies has a CTE smaller lower than a CTE of the molding compound. The method further includes forming redistribution lines over and electrically coupled to the plurality of device dies, and demounting the composite wafer from the carrier, and performing a die-saw to separate the composite wafer into a plurality of packages. Each of the plurality of packages includes one of the device dies, and is free from dummy dies therein.

In accordance with yet other embodiments, a method includes placing a plurality of dummy dies in recesses of a mold, and picking up the plurality of dummy dies simultaneously using a vacuum suction plate. The vacuum suction plate includes a plurality of holes, each aligned to one of the plurality of dummy dies during the picking up. The plurality of dummy dies picked up by the vacuum suction plate is released onto a die-attach film, wherein the die-attach film is laminated on a carrier. The plurality of dummy dies is distributed overlapping peripheral regions of the carrier, with an inner region of the carrier encircled by the peripheral region free from overlying dummy dies. The method further includes placing a plurality of device dies overlapping the inner region of the carrier, molding the plurality of dummy dies and the plurality of device dies in a molding compound to form a composite wafer, forming redistribution lines over and electrically coupled to the plurality of device dies, and performing a die-saw to separate the composite wafer into a plurality of packages.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure.

Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a plurality of dummy dies over a carrier, wherein the plurality of dummy dies is placed overlapping a peripheral area of the carrier, with the peripheral area encircling an inner area, wherein none of the plurality of dummy dies is placed to overlap the inner area;
   placing a plurality of device dies over the carrier, wherein the plurality of device dies is placed overlapping the inner area of the carrier;
   molding the plurality of dummy dies and the plurality of device dies in a molding compound;
   forming redistribution line over and electrically coupled to the device dies; and
   performing a die-saw to separate the device dies and the molding compound into a plurality of packages.

2. The method of claim 1, wherein the plurality of packages is free from dummy dies therein.

3. The method of claim 1, wherein the placing the plurality of dummy dies comprises picking up the plurality of dummy dies one by one, and placing the plurality of dummy dies over the carrier one by one.

4. The method of claim 1, wherein the placing the plurality of dummy dies comprises:
   placing the plurality of dummy dies in recesses of a mold; and
   transferring the plurality of dummy dies over the carrier, wherein relative positions of the plurality of dummy dies on the carrier are same as relative positions of the plurality of dummy dies in the recesses of the mold.

5. The method of claim 4, wherein the transferring the plurality of dummy dies comprises:
   simultaneously picking up the plurality of dummy dies from the mold using a vacuum suction plate; and
   simultaneously placing the plurality of dummy dies over the carrier.

6. The method of claim 4, wherein the transferring the plurality of dummy dies comprises:
   heating the mold and plurality of dummy dies; and
   contacting the plurality of dummy dies to an adhesive die-attach film, wherein the adhesive die-attach film is laminated on the carrier.

7. The method of claim 1, wherein the peripheral area of the carrier has a width smaller than about 25 mm.

8. A method comprising:
   placing a plurality of dummy dies on a die-attach film, wherein the die-attach film is further overlying a carrier;
   placing a plurality of device dies on the die-attach film, wherein the plurality of dummy dies overlaps a peripheral region of the carrier, and wherein the plurality of device dies overlaps an inner region of the carrier;
   molding the plurality of dummy dies and the plurality of device dies in a molding compound to form a composite wafer, wherein the plurality of dummy dies has a Coefficient of Thermal Expansion (CTE) lower than a CTE of the molding compound;
   forming redistribution lines over and electrically coupled to the plurality of device dies;
   demounting the composite wafer from the carrier; and
   performing a die-saw to separate the composite wafer into a plurality of packages, wherein each of the plurality of packages comprises one of the device dies, and is free from dummy dies therein.

9. The method of claim 8, wherein the plurality of dummy dies has sizes different from each other.

10. The method of claim 8, wherein the carrier comprises a glass carrier, and wherein the plurality of dummy dies comprises glass dies.

11. The method of claim 8, wherein the placing the plurality of dummy dies comprises:
    placing the plurality of dummy dies in recesses of a mold; and
    transferring the plurality of dummy dies onto the die-attach film, wherein relative positions of the plurality of dummy dies on the die-attach film are same as relative positions of the plurality of dummy dies in the recesses of the mold.

12. The method of claim 11, wherein the placing the plurality of dummy dies in the recesses comprises:
    pouring the plurality of dummy dies over the mold; and
    vibrating the mold and the plurality of dummy dies.

13. The method of claim 11, wherein the transferring the plurality of dummy dies comprises:
    simultaneously picking up the plurality of dummy dies using a vacuum suction plate; and
    simultaneously placing the plurality of dummy dies over the carrier.

14. The method of claim 11, wherein the transferring the plurality of dummy dies comprises:
    heating the mold and the plurality of dummy dies; and
    contacting the plurality of dummy dies to the die-attach film.

15. A method comprising:
    placing a plurality of dummy dies in recesses of a mold;
    picking up the plurality of dummy dies simultaneously using a vacuum suction plate, wherein the vacuum suction plate comprises a plurality of holes, each aligned to one of the plurality of dummy dies during the picking up;
    releasing the plurality of dummy dies picked up by the vacuum suction plate onto a die-attach film, wherein the die-attach film is laminated on a carrier, and wherein the plurality of dummy dies is distributed overlapping peripheral regions of the carrier, with an inner region of the carrier encircled by the peripheral region free from overlying dummy dies;
    placing a plurality of device dies overlapping the inner region of the carrier;
    molding the plurality of dummy dies and the plurality of device dies in a molding compound to form a composite wafer;
    forming redistribution lines over and electrically coupled to the plurality of device dies; and
    performing a die-saw to separate the composite wafer into a plurality of packages.

16. The method of claim 15 further comprising, during the releasing the plurality of dummy dies, heating the die-attach film.

17. The method of claim 15, wherein the placing the plurality of dummy dies in the recesses comprises:
    pouring the plurality of dummy dies over the mold; and
    vibrating the mold and the plurality of dummy dies.

18. The method of claim 15, wherein the plurality of dummy dies has a Coefficient of Thermal Expansion (CTE) lower than a CTE of the molding compound.

19. The method of claim 18, wherein the plurality of dummy dies comprises glass dies.

20. The method of claim 18, wherein the redistribution lines extend beyond edges of the respective underlying ones of the plurality of device dies.

* * * * *